United States Patent [19]
Blonder et al.

[11] Patent Number: 5,135,605
[45] Date of Patent: Aug. 4, 1992

[54] METHODS FOR MAKING MIRRORS

[75] Inventors: Greg E. Blonder, Summit; Mark A. Cappuzzo, Linden; Harold R. Clark, Fanwood; Ronald E. Scotti, White House Station; Yiu-Huen Wong, Summit, all of N.J.

[73] Assignee: AT&T Bell Laboratories, Murray Hill, N.J.

[21] Appl. No.: 692,433

[22] Filed: Apr. 29, 1991

[51] Int. Cl.$^5$ .................. H01L 21/306; B44C 1/22; C23F 1/00; C03C 15/00

[52] U.S. Cl. ................................ 156/628; 156/656; 156/657; 156/659.1; 156/661.1; 156/651; 156/663

[58] Field of Search ............... 156/628, 644, 648, 649, 156/651, 653, 656, 657, 659.1, 661.1, 662, 663; 65/31; 372/50; 350/96.12; 357/30, 55

[56] References Cited

U.S. PATENT DOCUMENTS

| | | | |
|---|---|---|---|
| 4,692,207 | 9/1987 | Bouadma et al. | 156/649 |
| 4,750,799 | 6/1988 | Kawachi et al. | 350/96.11 |
| 4,784,722 | 11/1988 | Liau et al. | 156/649 |
| 4,869,780 | 9/1989 | Yang et al. | 156/643 |
| 4,938,841 | 7/1990 | Shahar et al. | 156/657 X |

OTHER PUBLICATIONS

"Improved Reliability of Electron Devices Through Optimized Coverage of Surface Topography", W. Kern et al., *IEEE 11th Annual Proceedings, Reliability Physics Symposium*, 1973, pp. 214–223.

"The Use of Silane Silicon Dioxide Films to Contour Oxide Edges", by L. Hall et al., *Thin Solid Films*, vol. 9, 1972, pp. 447–455.

"Application of Ion Implantation to VLSI", *VLSI Handbook*, Norman Einsprach, Ed., Acadmic Press, 1985, pp. 476–478.

"Dynamic Etch Mask Technique for Fabricating Tapered Semiconductor Optical Waveguides and Other Structures", by A. Shahar et al., *Applied Physics Letters*, vol. 56, No. 12, Mar. 19, 1990, pp. 1098–1100.

"Surface-Emitting GaInAsP/InP Laser with Low Threshold Current and High Efficiency", by Z. Liau et al., *Applied Physics Letters*, vol. 46, No. 2, Jan. 15, 1985, pp. 115–117.

"Surface-Emitting GaAlAs/GaAs Linear Laser Arrays with Etched Mirrors", by J. Yang et al., *Applied Physics Letters*, vol. 49, No. 18, Nov. 3, 1986, pp. 1138–1139.

"Hybrid Approach to Two-Dimensional Surface-Emitting Diode Laser Arrays", by J. Donnelly et al., *Applied Physics Letters*, vol. 53, No. 11, Sep. 12, 1988, pp. 938–940.

"Surface-Emitting GaAs/AlGaAs Multi-Quantum Well Lasers with Optical Bistability", by T. Yuasa et al., *CLEO Proceedings*, 1988, pp. 258–259.

"Guided-Wave Optical Chip-to-Chip Interconnectsion", by M. Kobayashi et al., *Electronics Letters*, vol. 23, No. 4, Feb. 12, 1987, pp. 143–144.

"Self-Aligned Flat-Pack Fibre-Photodiode Coupling", by B. Hillerich et al., *Electronics Letters*, vol. 24, No. 15, Jul. 21, 1988, pp. 918–919.

"Glass Waveguides on Silicon for Hybrid Optical Packaging", by C. Henry et al., *Journal of Lightwave Technology*, vol. 7, No. 10, Oct. 1989, pp. 1530–1539.

W. Kern et al., V-1 Chemical Etching, Part V in *Thin Film Processes*, edited by J. L. Vossen and W. Kern, Academic Press, New York, 1978, pp. 409–410.

*Primary Examiner*—William A. Powell
*Attorney, Agent, or Firm*—R. B. Anderson

[57] ABSTRACT

A turning mirror in an optical waveguide structure is made by etching in the upper surface of the structure a cavity (18) that intercepts the path of light propagated by the waveguide (15, 16, 13). Preferably, the cavity is made to be asymmetric with the side (25) of the cavity remote from the waveguide sloping at typically a forty-five degree angle. The asymmetry can be introduced by using mask and etch techniques and treating the surface of the structure such that the etchant undercuts the mask on the side of the cavity remote from the waveguide to a greater extent than it undercuts the mask on the side of the cavity adjacent the waveguide.

15 Claims, 4 Drawing Sheets

METHODS FOR MAKING MIRRORS

TECHNICAL FIELD

This invention relates to methods for making mirrors and, more particularly, to methods for making turning mirrors in conjunction with glass optical waveguides.

BACKGROUND OF THE INVENTION

One of the major advances in communications in recent years has been the increased use of optical systems for carrying very large quantities of information with low distortion and at low cost over great distances. Optical systems are also promising for such purposes as computing because of the inherently high speeds at which they can be operated. For these reasons, considerable work has been done to develop convenient techniques for operating on transmitted information-carrying light to produce various device functions. Devices known variously as hybrid optical integrated circuits, photonics modules, or hybrid optical packages have been proposed for controlling light using waveguide patterns similar to the electronic circuit patterns used in electronic integrated circuits.

The paper, "Glass Waveguides on Silicon for Hybrid Optical Packaging," C. H. Henry et al., *Journal of Lightwave Technology*, Vol. 7, No. 10, October 1989, pp. 1530-1539 describes a method using successive layers of glass over a silicon substrate to define optical waveguides. One layer of glass having a relatively high refractive index is the core layer and is surrounded by glass having a lower index of refraction. During operation, the light is confined in the core glass because of the lower refractive index of surrounding glass and, as a consequence, the configuration of the core layer defines the path of the light. Such waveguide configurations, sometimes referred to as optical circuits, can be fabricated with precision by masking and etching the core layer. The Henry et al. paper describes how various passive devices such as couplers and polarization splitters can be made from optical waveguides fabricated in this manner. A similar approach for defining optical circuits is described in the patent of Kawachi et al., U.S. Pat. No. 4,557,099, granted Jun. 14, 1988.

Any hybrid optical packaging approach of the type described above will typically require a number of forty-five degree mirrors, known in the art as turning mirrors, for coupling light between optical waveguides of the device and external devices such as lasers and photodetectors. The Kawachi et al. patent uses separately formed glass elements having forty-five degree mirror surfaces for providing this function.

The value of hybrid optical packaging is that it is amenable to mass production using known techniques of chemical vapor deposition, photolithography, and other techniques described in the Henry et al. paper. It would be desirable to be able to include turning mirrors in such packaged devices without incurring significant additional costs.

SUMMARY OF THE INVENTION

In a structure of the type described in the aforementioned Henry et al. publication, the core of the waveguide, since it is surrounded by glass of low refractive index, is effectively embedded a small distance below the upper surface of the body of the glass structure. As a consequence, a turning mirror in the structure can be made by etching a cavity in the upper surface that intercepts the path of light propagated by the waveguide. For improving reflection of intercepted light, the side of the cavity opposite the end of the waveguide can be metallized. Unfortunately, such a turning mirror is not very efficient because the sides of the cavity, when etched in a normal manner, do not describe an angle such as forty-five degrees, which would normally be optimum for removing light from the end of the waveguide or injecting light into the waveguide.

In accordance with one aspect of the invention, prior to etching the cavity, part of the interface of the mask and the body is treated such that the etchant undercuts the mask on the side of the cavity remote from the waveguide to a greater extent than it undercuts the mask on the side of the cavity adjacent the waveguide. By etching to a proper depth, and by properly treating the interface portion, one can obtain a cavity that has a side that is nearly normal to the surface on the side of the cavity adjacent the waveguide, while having a side which is at substantially forty-five degrees, or some other appropriate angle, to the surface on the side opposite the waveguide. Thus, light can be emitted from the waveguide into the cavity with minimum refraction, and can be reflected with maximum efficiency by the side of the cavity opposite the waveguide. The angled surface is preferably metallized to optimize such reflection. The reflective surface can also be used to inject light into the waveguide from an external source such as a laser.

In accordance with one embodiment, the treating step comprises the step of coating part of the surface of the glass body with a material that etches at a faster rate than the glass body. For example, a thin coating of aluminum may be used, which can be made to have a much higher etch rate than glass. When coated over the glass body along the area that is to constitute the side of the cavity remote from the optical waveguide, the faster etching aluminum causes the side of the cavity on which it is coated to etch at a greater angle with respect to the mask, and this angle can be made to approximate forty-five degrees.

In another embodiment, the treating comprises the step of implanting ions in part of the upper surface of the glass body. This increases the rate of etch of ion implanted portion with respect to the part of the body in which no ion implant has been made and thus makes possible the selective etch undercut desired. In another embodiment, the surface is heavily doped so as to increase its etch rate.

As will be seen from the detailed description below, empirical methods are used to obtain a slope of the cavity which is close to forty-five degrees. While forty-five degrees is mentioned for illustration, other slopes may be desired, depending upon the package structure or external devices with which it is used. These and other objects, features and benefits of the invention will be better understood from a consideration of the following detailed description taken in conjunction with the accompanying drawing.

DETAILED DESCRIPTION

The drawings and description are greatly simplified in an effort to described clearly the nature of the invention. The drawings are not to scale, and indeed are intentionally distorted to reveal more clearly certain features of the invention.

Figure 1:
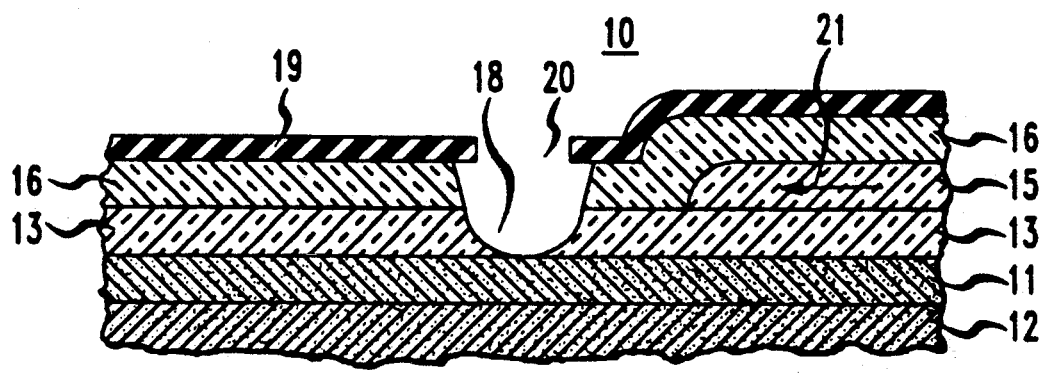
FIG. 1 is a schematic view of part of an optical waveguide package illustrating one aspect of the invention.

Referring now to FIG. 1, there is shown part of an optical waveguide structure 10 that has been made according to the aforementioned C. H. Henry et al. paper. A silicon dioxide layer 11 is first made over a silicon substrate 12. Over the layer 11, a glass layer 13 is formed, which may have a height of five microns. The layer 13 may be of a glass known as P-TEOS glass, which means that it is doped with phosphorous and has been deposited by a reaction of tetraethylorthosilicate (TEOS). Layer 13 may be doped to a concentration of two percent by weight of phosphorous so as to have a refractive index of approximately 1.4604. Upon layer 13 is formed the waveguide core layer 15, which may be phosphosilicate glass, doped with phosphorous to a concentration of eight percent so as to have an index of refraction of approximately 1.4723. After layer 15 has been formed over layer 13, it is patterned by using masking and etching techniques to form desired waveguide paths. As described in the Henry et al. paper, the waveguide paths defined by the patterning can cause various lightwave interactions to produce any of various device functions. After patterning of layer 15, a 0.5 μm layer (not shown) of seven percent phosphorus glass may be deposited over the etched core and the entire structure heated. Heating to a temperature of nine hundred degrees Centigrade causes the glass to reflow and the core layer 15 to change shape from a rectangular cross-section to a more semi-circular configuration. This smooths out any irregularities in the surface, thus decreasing the optical loss. Next, layer 16 is deposited over it, which may be identical with layer 13. Layers 13 and 16 then constitute cladding layers for the optical waveguide, while layer 15 is the core layer. Typical layer thicknesses are: layer 11, ten microns; layer 13, five microns; layer 15, five microns; layer 16, seven microns.

An optical waveguide structure typically requires a number of turning mirrors either to couple light onto the ends of waveguides or to withdraw light from waveguides. We have determined that a promising method for making a turning mirror is to use masking and etching for defining a cavity 18 in the upper surface of layer 16 adjacent the end of the waveguide defined by layer 15. That is, a polysilicon mask layer 19 is formed over glass layer 16, which is selectively etched so as to define within it an aperture 20. Thereafter, the portion of the glass exposed by aperture 20 is subjected to an etchant which attacks glass, but does not attack appreciably the mask layer 19. The etchant therefore etches the cavity 18 into the glass body as defined by the aperture 20. Illustratively, the mask layer may be 0.5 μm polysilicon and the etchant a 7:1 buffered oxide etch with surfactant. Aperture 20 is formed by conventional photolithographic masking and etching. After cavity 18 is formed, the polysilicon mask layer 19 is removed by etching.

With the cavity etched sufficiently deep to intercept the path of the light propagating on the optical waveguide, defined by core layer 15, the side of the cavity may be used to reflect light out of the structure. For example, (after removal of mask layer 19) light propagating on the waveguide as indicated by arrow 21 would be projected into cavity 18 and would be reflected out of the optical waveguide package by the side of the cavity opposite the waveguide. The reflecting side of the cavity could be selectively metallized to improve its reflectivity. A drawback of the structure of FIG. 1 is that the reflective surface is not necessarily at an optimum angle for retrieving light from the package or introducing light to it. Generally speaking, it is easier to align lenses and other elements along lines nearly perpendicular to the surface of the optical waveguide package, rather than at severe angles to it. This drawback is overcome by the method for making the cavity illustrated in FIGS. 2–6.

Figure 2:
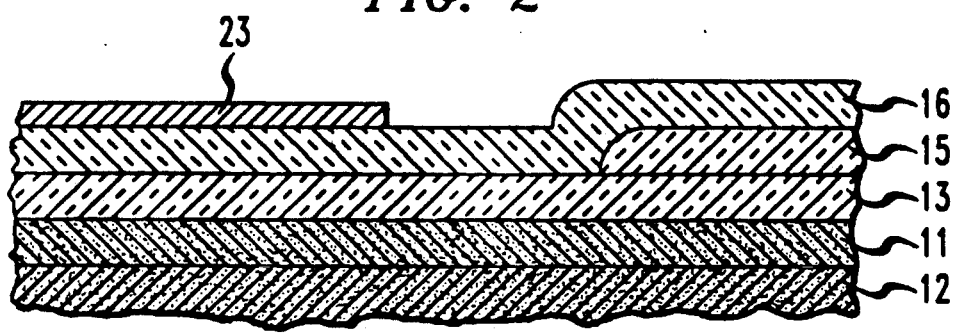
FIGS. 2-3 and 5-6 are schematic views illustrating successive steps in forming a cavity in an optical waveguide structure in accordance with one embodiment of the invention.

Referring to FIG. 2, the various layers may have the same constituencies and thicknesses as the corresponding layers of FIG. 1 and are therefore labeled with the same reference numerals. Prior to etching the cavity, a layer 23 of a material such as aluminum having a faster etch rate than that of glass is deposited over the portion of the glass body intended to constitute a reflecting surface of the etched cavity. Layer 23 may be 0.5 microns thick.

Figure 3:
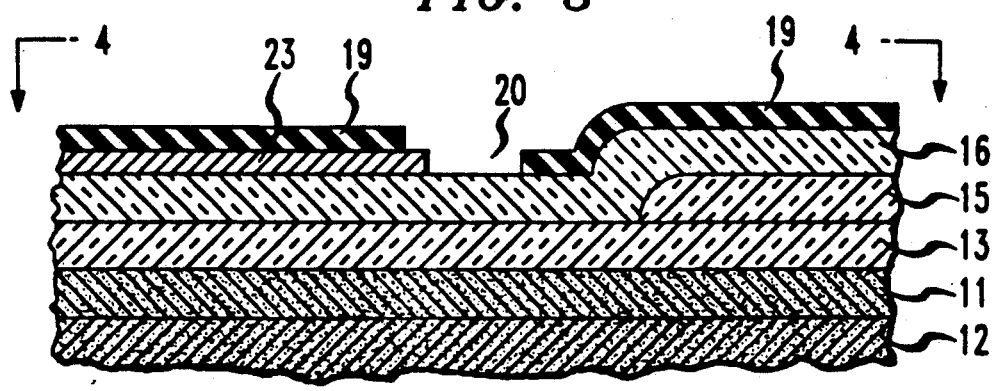
Figure 4:
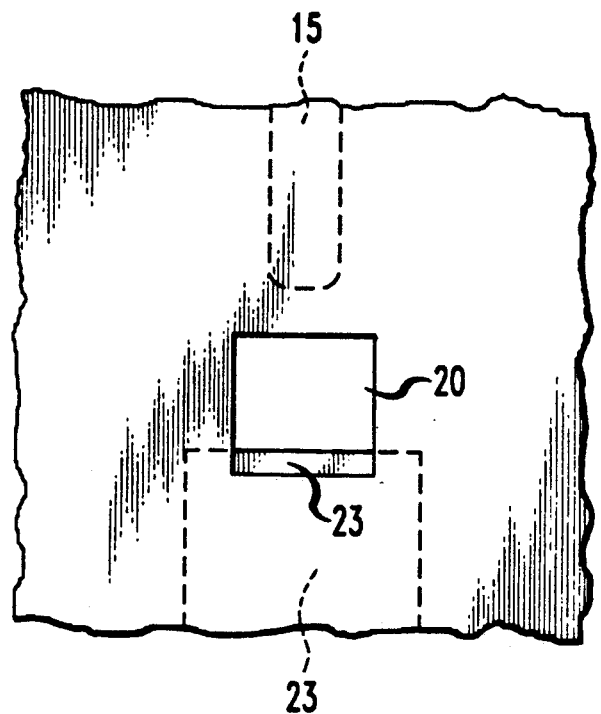
FIG. 4 is a view taken along lines 4—4 of FIG. 3.

Referring to FIG. 3, the mask layer 19 is deposited over the structure including aluminum layer 23, and an aperture 20 is formed in it as described above. FIG. 4, which is a top view of the structure of FIG. 3, shows the relationship of the aperture 20 with respect to the core layer 15 defining the optical waveguide and the aluminum layer 23. It is preferred that the aperture 20 slightly overlaps the aluminum layer 23, as shown, but this aspect is not critical, as will become clear later. A cavity is etched through aperture 20 using an etchant having one component that etches the aluminum layer 23 and another component that etches the glass, but at a slower rate than the aluminum. The component that etches the aluminum may be a mixture of phosphoric acid, nitric acid and acetic acid, while the component that etches the glass by be 7:1 buffered oxide etch with surfactant.

Figure 5:
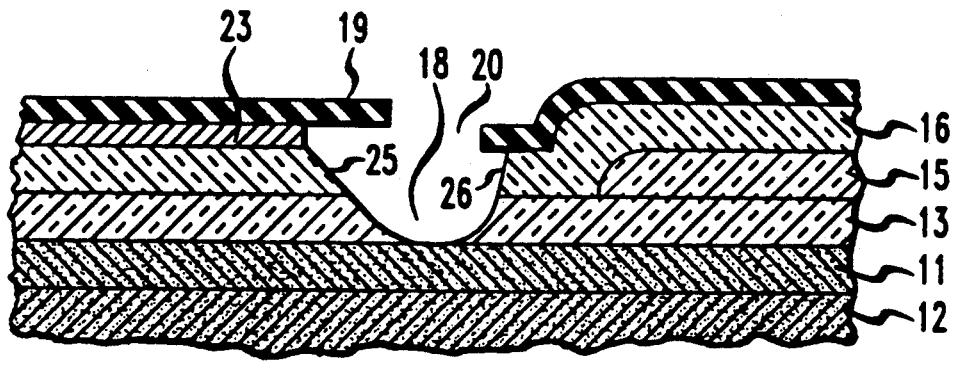

Referring to FIG. 5, when the etchant etches the cavity 18, aluminum layer 23 etches at a faster rate than the glass. Under such circumstances, the etchant inherently attacks the glass so as to form a substantially smooth side 25 of the cavity leading to layer 23. Another way of stating this is that the etchant undercuts mask 19 at a faster rate on the side 25 of the cavity containing layer 23 than on the side 26 adjacent the optical waveguide. With the normal undercut, the side 26 of the cavity adjacent the waveguide is nearly normal, which is desirable for minimizing refraction of light entering or leaving the cavity in the direction of waveguide 15. Ordinarily, the relevant parameters can be chosen such that side 25 extends at substantially a forty-five degree angle with respect to the axis of waveguide layer 15. The relevant parameters are, of course, the etch rate of the glass, the etch rate of the aluminum, the thickness of layer 23, and the depth of the cavity 18. These parameters are preferably arrived at empirically. Even if side 25 is not forty-five degrees, it will necessarily have a lower slope than side 26 because the etch rate of layer 23 is faster than that of glass, and this will constitute an improvement over the structure of FIG. 1.

Figure 6:
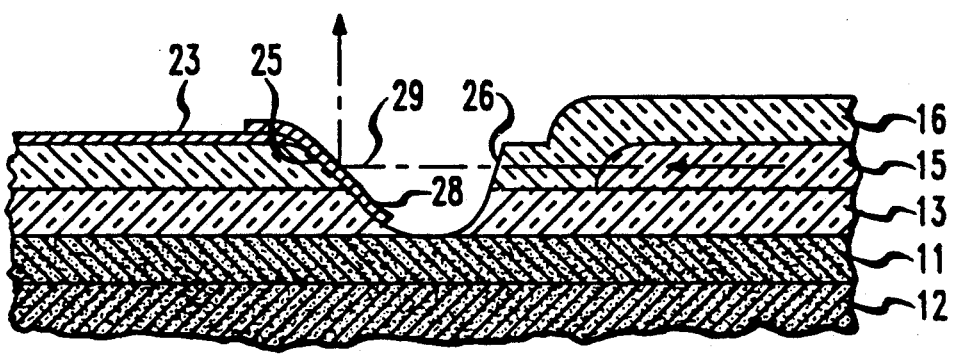

Referring to FIG. 6, the mask layer is removed and the side 25 of the cavity is preferably metallized to form a metal layer 28 for enhancing reflection. Light from the waveguide propagating along path 29 will then be reflected out of the package as shown. With the side 26 of the cavity nearly normal with respect to the path of the lightbeam, refraction at surface 26 will be minimized. A path having the reverse direction of path 29 is followed for coupling light into waveguide 15. Illustratively, the metal layer 28 may be made by sputtering over the entire surface successive layers of titanium, platinum and gold, which are then patterned by masking and etching, all of which is known from the integrated circuit art. Additional gold may be electroplated if the resulting surface is smooth and specular.

Figure 7:
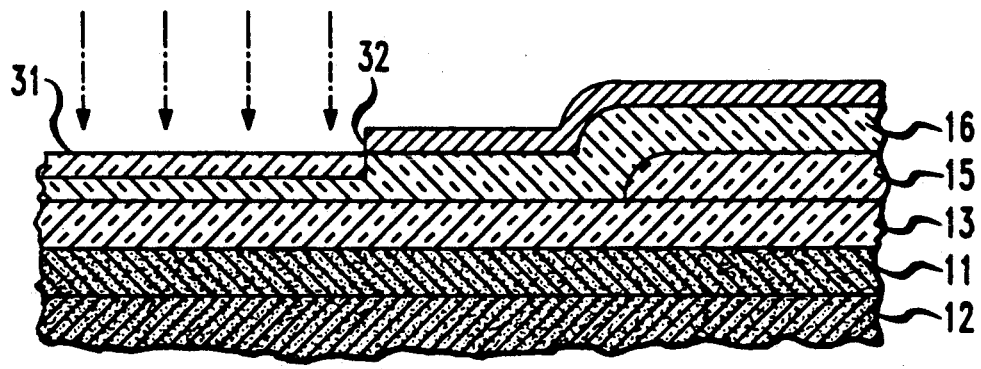
FIGS. 7 and 8 illustrate a method for making a cavity in accordance with another embodiment of the invention.

Referring now to FIG. 7, another method of treating the surface of the glass to make it preferentially etch at a faster rate is to ion implant a layer 31 as shown schematically by the arrows. The boundaries of layer 31 are controlled by a mask 32 which prevents ion implantation at other portions of the glass body. It can be shown that glass layers damaged by ion implantation etch at a faster rate than undamaged glass when subjected to a glass etchant. The layer 31 may typically be 0.1 microns thick and the ions may be argon implanted at a dosage of $1-9 \times 10^{13}$ ions per square centimeter. After implant, the mask 32 is removed, as by etching.

Figure 8:
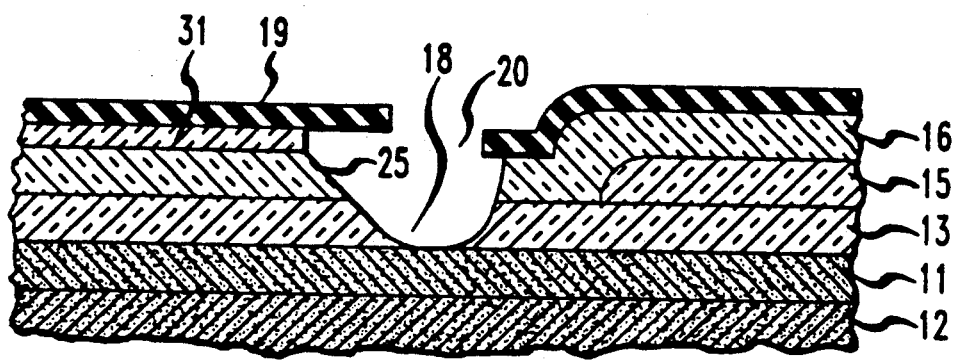

Referring to FIG. 8, the mask layer 19 is formed with an aperture 20 which preferably overlaps slightly the layer 31. Etching through aperture 20 forms the cavity 18 which is asymmetric for the same reasons as described with respect to FIG. 5. Since layer 31 etches at a faster rate than undamaged glass, it inherently causes a greater undercut of mask 19 and consequently a controlled slope to the side 25 of the cavity 18. The mask 19 is then removed, and the side 25 is metallized to form the structure shown in FIG. 6. The etchant may be 7:1 buffered oxide etch with surfactant.

Figure 9:
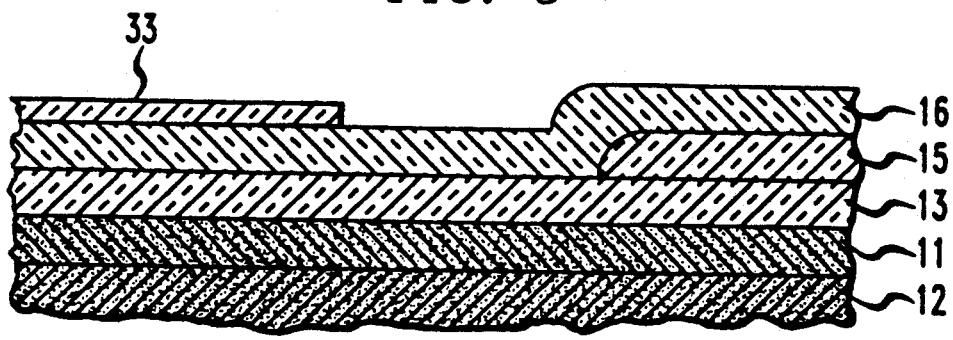
FIG. 9 illustrates still another embodiment of the invention.

Referring to FIG. 9, a layer 33 of unannealed four percent phosphosilicate glass is formed which has a higher etch rate than that of glass layers 13 and 16 because it is more highly doped, and therefore functions in the same manner as the ion implanted layer 31 of FIG. 7 and the aluminum layer 23 of FIG. 3. Thus, when the structure is masked and etched as in FIG. 8, an asymmetric cavity is formed with the final structure again being that shown in FIG. 6. In our experiments, layer 33 had a thickness of 0.5 micron and layers 16 and 13 were doped with two percent phosphorus as mentioned before.

The various methods described are illustrative of methods that can be used for making turning mirrors in waveguide package bodies by etching a cavity. Various methods for making the cavity asymmetric so as to produce a desired reflective slope have been described to illustrate the concept involved. Various materials other than those specifically described may be used to give the faster etch required for asymmetric mask undercutting. For example, metals other than aluminum have appropriately high etch rates when exposed to various etchants and would be expected to work; various other glasses and other materials could be used. In general, a layer of any material may be used if an etchant can be developed that etches the material at a higher etch rate than the glass in which the cavity is formed. The faster etch rate gives an asymmetric cavity having a reflecting side wall extending at any of various angles; the optimum angle may, for example, be less than forty-five degrees, depending on other design requirements. Various other embodiments and modifications may be made by those skilled in the art without departing from the spirit and scope of the invention.

I claim:

1. A method for making a turning mirror in an optical device comprising the steps of:
   forming near an upper surface of a glass body an optical waveguide which defines part of a path for propagating light;
   forming a masking layer over at least part of the upper surface of the glass body adjacent one end of the optical waveguide;
   making an opening in the mask layer adjacent one end of the waveguide;
   etching a cavity in the body which intercepts said path for propagating light by subjecting part of the body exposed by the opening to an etchant, the mask being resist to such etchant;
   prior to etching, treating part of the interface of the mask and the body such that the etchant undercuts the mask on the side of the cavity remote from the waveguide to a greater extent that it undercuts the mask on the side of the cavity adjacent the waveguide;
   and processing the side of the cavity opposite the waveguide to be reflective of light projected from the first end of the waveguide.

2. The method of claim 1 wherein:
   the step of processing the cavity comprises the step of metallizing the side of the cavity opposite the waveguide.

3. The method of claim 1 wherein:
   the treating step comprises the step of coating part of the surface of the glass body with a material that etches at a faster rate than the glass body when exposed to said etchant, thereby increasing the rate of undercut of the mask layer.

4. The method of claim 1 wherein:
   the treating step comprises the step of implanting ions in part of the upper surface of the glass body, thereby to increase the rate of etch of the ion implanted portion with respect to the part of the glass body in which no ion implant has been made.

5. The method of claim 1 wherein:
   the treating step comprises the step of coating part of the upper surface of the glass body with glass that has been doped so as to have a higher etch rate than the glass body that has not been so doped.

6. The method of claim 1 wherein:
   the treating step comprises the step of coating part of the upper surface of the glass body with a metal;
   and the etchant includes a component that etches the metal at a faster rate than the rate at which the glass is etched.

7. A method for making a turning mirror in a body in which an optical waveguide has been formed on or near a first surface thereof comprising the steps of:
   forming on the first surface of the body, opposite a first end of the waveguide, a first layer of a material having a higher etch rate than the etch rate of the body when exposed to a first etchant;
   forming over at least part of the first layer a second layer of mask material essentially resistant to the first etchant;

forming in the second layer between the first end of the waveguide and the first layer a mask opening;

exposing the first surface of the body to the first etchant, whereby a cavity is formed in the body which has a steeper sloper on the side nearest the waveguide than on the side most remote from the waveguide;

and processing the side of the cavity most remote from the waveguide to be reflective of light projected from the first end of the waveguide.

8. The method of claim 7 wherein:
the first layer comprises a layer of metal.

9. The method of claim 7 wherein:
the step of forming the first layer comprises the step of implanting ions in part of the upper surface of the body, thereby to increase the etch rate of the ion implanted portion with respect to the remainder of the body.

10. The method of claim 7 wherein:
the first layer comprises a layer of glass doped with a higher concentration of impurities than the body.

11. The method of claim 8 wherein:
the metal is aluminum.

12. A method for making an optical package comprising the steps of:

forming on a substrate a first layer of relatively low refractive index glass;

forming over the first layer a second layer of relatively high refractive index glass;

patterning the second layer to define optical waveguide portions for propagating light along optical paths;

forming over the second layer a third layer of relatively high refractive index glass;

the third layer overlying a first end of a first optical waveguide portion defined by part of the second layer;

and forming an asymmetric cavity in the third layer and at least part of the first layer, the cavity formed being adjacent the first end of the first optical waveguide portion and intersecting the optical path defined by the first optical waveguide portion, said cavity having a steeper slope on a first side thereof which is closest to the waveguide portion than on a second side thereof which is most remote from the waveguide portion.

13. The method of claim 12 wherein:
the step of forming the cavity comprises the step of masking a major portion of the third layer and etching the third layer and at least part of the first layer with a glass etchant.

14. The method of claim 13 wherein:
the step of forming the cavity further comprises the step of treating part of the interface of the mask and the third layer such that the etchant undercuts the mask on the side of the cavity remote from the waveguide portion to a greater extent than it undercuts the mask on the side of the cavity adjacent the waveguide portion.

15. The method of claim 14 wherein:
the treating step comprises the step of coating part of the surface of the third layer with a material that etches at a faster rate than glass when exposed to said etchant, thereby increasing the rate of undercut of the mask layer.

* * * * *